United States Patent [19]
Chun

[11] Patent Number: 5,933,709
[45] Date of Patent: Aug. 3, 1999

[54] SEMICONDUCTOR PACKAGE AND METHOD FOR FABRICATING SAME

[75] Inventor: Dong-Seok Chun, Cheongju, Rep. of Korea

[73] Assignee: LG Semicon Co., Ltd, Choongcheongbuk-do, Rep. of Korea

[21] Appl. No.: 08/895,450

[22] Filed: Jul. 16, 1997

[30] Foreign Application Priority Data

Dec. 30, 1996 [KR] Rep. of Korea .................. 1996-77510

[51] Int. Cl.⁶ .................................................. H01L 21/44
[52] U.S. Cl. .......................... 438/122; 438/121; 438/123; 257/712; 257/713
[58] Field of Search .................................. 438/121, 122, 438/123, 124; 257/712, 713, 717, 720

[56] References Cited

U.S. PATENT DOCUMENTS

| | | | |
|---|---|---|---|
| 5,091,341 | 2/1992 | Asada et al. ............................ | 438/122 |
| 5,362,679 | 11/1994 | Wakefield ................................ | 438/122 |
| 5,455,457 | 10/1995 | Kurohawa ................................ | 257/712 |
| 5,533,256 | 7/1996 | Call et al. ................................ | 438/122 |
| 5,552,636 | 9/1996 | Darveaux ................................ | 257/717 |
| 5,552,637 | 9/1996 | Yamagata ................................ | 257/717 |
| 5,619,070 | 4/1997 | Kozono ................................... | 257/717 |
| 5,805,427 | 9/1998 | Hoffman ................................. | 438/124 |

*Primary Examiner*—Kevin M. Picardat
*Attorney, Agent, or Firm*—Morgan, Lewis & Bockius LLP

[57] ABSTRACT

A semiconductor package including a first heat slug having a substantially flat shape and a second heat slug coupled to the first heat slug. A semiconductor chip is mounted on an inner surface of the first heat slug and a third heat slug is fixed to a central portion of the semiconductor chip. A plurality of inner leads are fixed to sides of the semiconductor chip and outer leads extend from the inner leads and are bent outward with respect to the inner leads. Conductive wires connect the inner leads to the semiconductor chip. A mold portion seals the semiconductor or chip, the inner leads, a portion of the outer leads, and the conductive wire.

13 Claims, 4 Drawing Sheets

SEMICONDUCTOR PACKAGE AND METHOD FOR FABRICATING SAME

BACKGROUND OF THE INVENTION

1. Field of the Invention

The present invention relates to a semiconductor package, and more particularly to a semiconductor package having heat slug and method for fabricating the same. Although the present invention is suitable for a wide variety of semiconductor chips, it is especially suitable for high power chips.

2. Description of the Related Art

FIG. 1 is a cross-sectional view illustrating a conventional bottom lead semiconductor package. Referring to FIG. 1, the conventional bottom lead package includes a plurality of bottom leads 2a electrically connected to a printed circuit board (PCB) (not shown), inner leads 2b upwardly bent from each bottom lead 2a, a semiconductor chip 1 mounted on an upper surface of each bottom lead 2a by an adhesive material 3, conductive wires 4 electrically connecting chip pads (not shown) of the semiconductor chip 1 and the inner leads 2b, and a molding portion 5. The molding portion encapsulates the semiconductor chip 1, the bottom leads 2a, the inner leads 2b, and the conductive wires 4, but exposes lower surfaces of the bottom leads 2a to allow mounting and connection to the PCB.

However, the above-described conventional bottom lead semiconductor package has disadvantages in that the heat generated by the semiconductor chip 1 is not effectively radiated outward of the chip due to the molding portion 5 which has a low heat transfer ratio. In particular, the package is not suitable for a high power chip which demands a high heat transfer ratio.

SUMMARY OF THE INVENTION

Accordingly, the present invention is directed to a semiconductor package and method for fabricating the same that substantially obviates one or more of the problems due to limitations and disadvantages of the related art.

It is an object of the present invention to provide an improved semiconductor package which is capable of increasing a heat transfer efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor package includes a flat-shaped first heat slug, a second heat slug perpendicular with respect to lateral sides of the first heat slug and being integral therewith, a semiconductor chip mounted on an upper surface of the first heat slug by an adhesive material, a third heat slug fixed to an upper central portion of the semiconductor chip by an adhesive material, a plurality of inner leads fixed to both sides of an upper surface of the semiconductor chip by an adhesive material, a plurality of bottom leads upwardly bent from the inner leads, conductive wires connecting the inner leads and chip pads, and a molding portion formed by filling a portion defined by the first through third heat slugs with a molding resin, for thus sealing the semiconductor chip, the inner leads, the bottom leads, and the conductive wires, whereby the bottom leads are partially exposed to the outside.

In another aspect of the present invention, a semiconductor package comprises a first heat slug; a second heat slug coupled to the first heat slug; a semiconductor chip mounted on an surface of the first heat slug; a plurality of leads attached to semiconductor chip; conductive wires connecting the plurality of leads to the semiconductor chip ; and a mold portion sealing the semiconductor chip, the plurality of leads, and the conductive wires.

In another aspect of the present invention, a method for making a semiconductor package comprises the steps of forming a first heat slug; forming a second heat slug coupled to the first heat slug; mounting a semiconductor chip on the first heat slug; attaching a plurality of leads to the semiconductor chip; connecting the leads to the semiconductor chip using conductive wires; and molding the semiconductor chip, the leads, and the conductive wires to form the package.

In a further aspect of the present invention, a semiconductor package comprises a first heat slug; a second heat slug coupled to the first heat slug; a semiconductor chip mounted on an upper surface of the first heat slug; a plurality of leads attached to the semiconductor chip; a plurality of conductive wires connecting the plurality of leads to the semiconductor chip; a third heat slug attached to the semiconductor chip; and a mold portion sealing the semiconductor chip, the plurality of leads, and the conductive wires.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
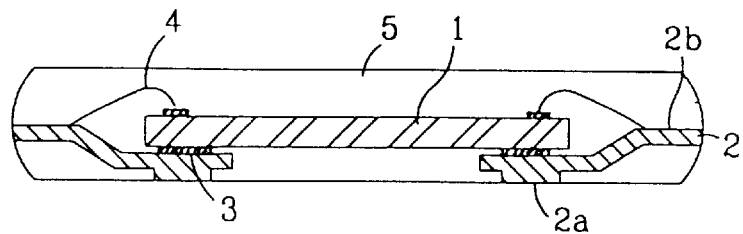
FIG. 1 is a cross-sectional view illustrating a conventional bottom lead semiconductor package.
Figure 2:
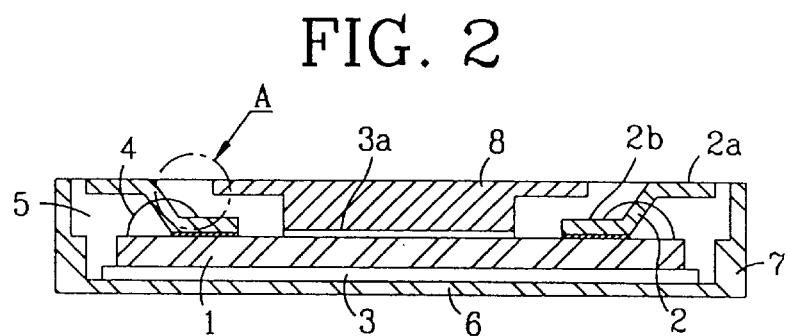
FIG. 2 is a cross-sectional view illustrating a bottom lead semiconductor package according to an embodiment of the present invention.

FIG. 2 is a cross-sectional view illustrating a bottom lead semiconductor package according to the present invention. Referring to FIG. 2, at lateral portions of a first heat slug (first heat sink) 6, a second heat slug 7 is vertically formed. The second heat slug 7 may be attached to the first heat slug 6, or may be integrally formed therewith. The first and second heat slugs 6 and 7 are preferably made of a metal and ceramic material which has a high heat transfer ratio and good mechanical strength. The semiconductor chip 1 is mounted on the first heat slug 6 by using a first adhesive material 3. The first adhesive material is preferably made of a material having a good heat transfer ratio. The inner leads 2b of a lead frame 2 are fixed to both sides of the semiconductor chip 1 by using an adhesive material, and a third heat slug 8 is fixed to a central portion of an upper surface of the semiconductor chip 1 by using a second adhesive material 3a. The lead frame 2 is preferably formed such that bottom leads 2a thereof are upwardly bent from the inner leads 2b and is preferably made of a copper alloy or a nickel alloy.

Figure 4:
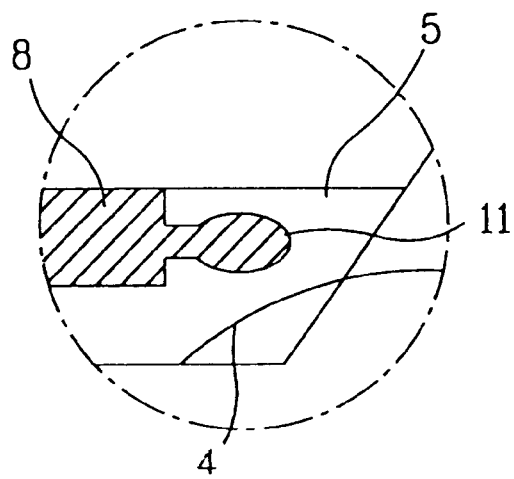
FIG. 4 is an enlarged cross-sectional view of the portion "A" in FIG. 2.

The third heat slug 8 is preferably made of a metal or ceramic material which has a good heat transfer ratio and mechanical strength similar to the first and second heat slugs 6 and 7. In addition, the third heat slug 8 preferably includes a flange 11 formed at edge portions at both sides of the third heat slug 8. A protruding portion 11a extends from each of the flange 11, as shown in FIG. 4. In particular, the protruding portion 11a is formed in a circular shape or a polygonal shape for increasing the adherence of the third heat slug 8 to the molding portion 5.

The inner leads 2b and chip pads (not shown) of the semiconductor chip 1 are connected by conductive wires 4 made of a conductive material. A portion defined by the first through third heat slugs 6, 7, and 8 are filled with a molding resin for sealing the semiconductor chip 1, the inner leads 2b, the bottom leads 2a, and the conductive wires 4. as shown in FIG. 3, the molding portion 5 is formed so that the bottom leads 2a are partially exposed therefrom.

Figure 3:
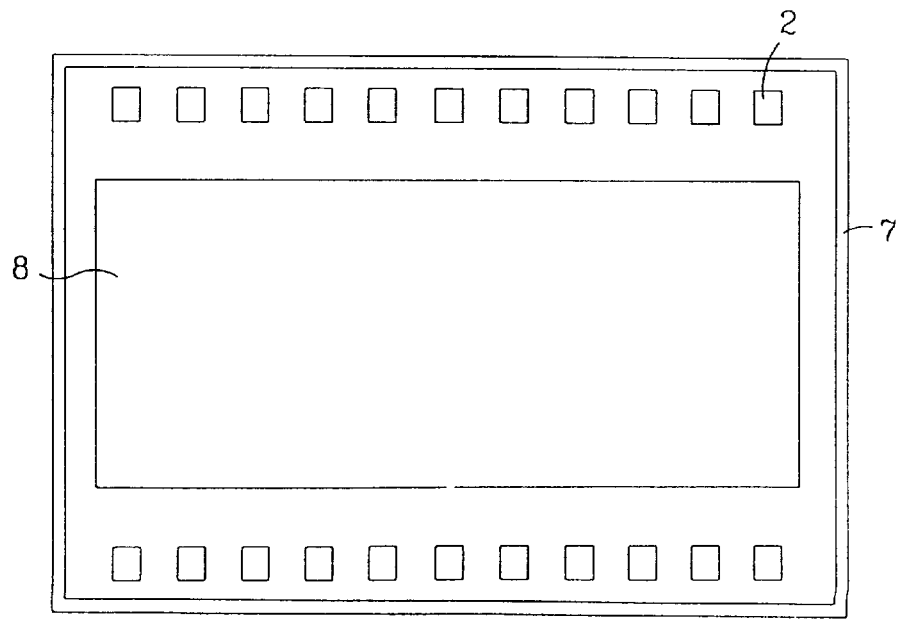
FIG. 3 is a bottom view illustrating the bottom lead semiconductor package according to the present invention.

As shown in FIG. 3, the bottom leads 2a can be electrically connected to a PCB (not shown) and most of the bottom portion of the bottom lead semiconductor package excluding the bottom leads 2a are preferably covered by the third heat slug 8.

Figure 5:
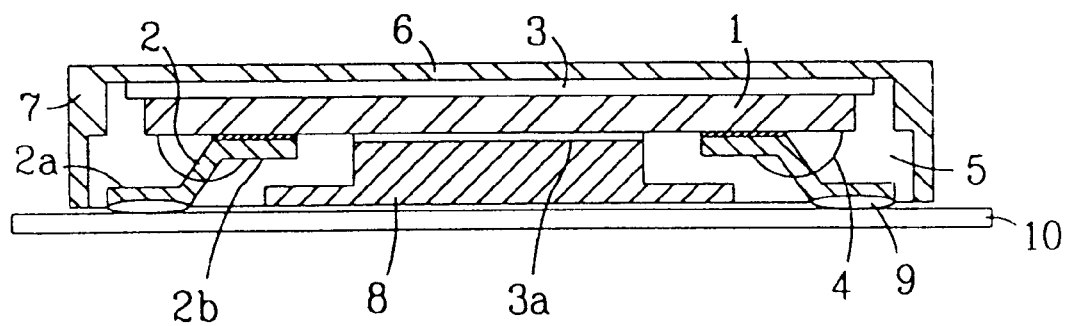
FIG. 5 is a cross-sectional view illustrating a bottom lead semiconductor package according to the present invention mounted on a printed circuit board (PCB)

FIG. 5 is a cross-sectional view illustrating the state wherein a bottom lead semiconductor package according to the present invention is mounted on a PCB (Printed circuit Board). Referring to FIG. 5, only the bottom leads 2a are connected to the PCB 10 by using solder 9.

FIGS. 6a through 6h are cross-sectional views illustrating a fabrication method of the bottom lead semiconductor package according to the present invention. Although reference is made herein to the "upper" sides of elements, it should be understood that this and other reference terms are only to correspond with the depictions in the drawings.

Figure 6A:
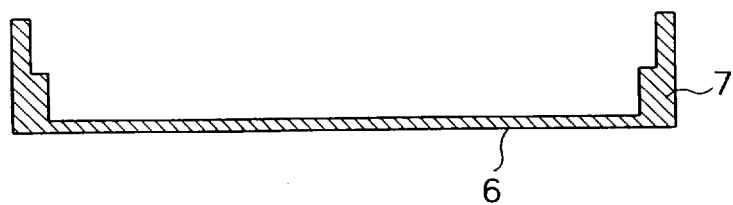
FIGS. 6a through 6H are cross-sectional views illustrating a fabrication method of a bottom lead semiconductor package according to the present invention.
Figure 6B:
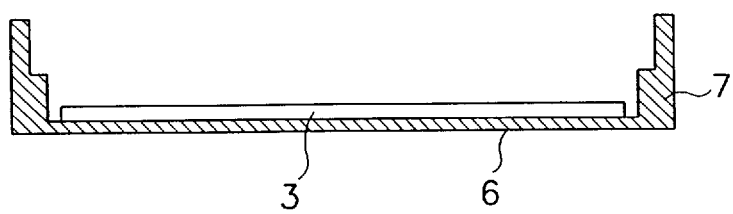

FIG. 6a is a cross-sectional view illustrating a step of vertically joining the second heat slug 7 to lateral edge portions of the flat plate-shaped first heat slug 6. The first and second heat slugs 6 and 7 may be integrally formed, preferably, and are made of a metal and ceramic material which has a good heat transfer ratio and mechanical strength. FIG. 6b is a cross-sectional view illustrating a step of uniformly coating the first adhesive material 3 on the upper surface of the first heat slug 6. The first adhesive material 3 is made of a material having a good heat transfer efficiency.

Figure 6C:
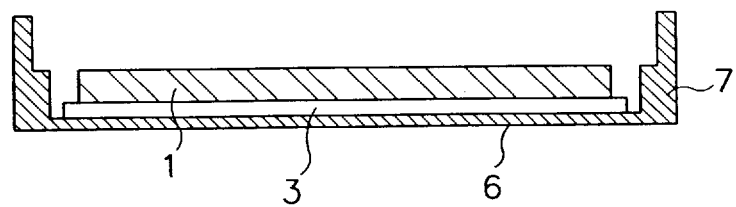
Figure 6D:
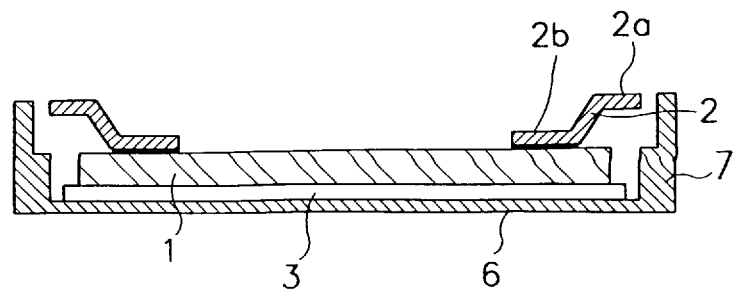

FIG. 6c is a cross-sectional view illustrating a step of fixing the semiconductor chip 1 on the upper surface of the first heat slug 6 by using the first adhesive material 3. FIG. 6d is a cross-sectional view illustrating a step of fixing the inner leads 2b of the lead frame 2 on both sides of the upper surface of the semiconductor chip 1 by using an adhesive material. The lead frame 2 is upwardly bent from the inner leads 2b, for forming a bottom lead structure.

Figure 6E:
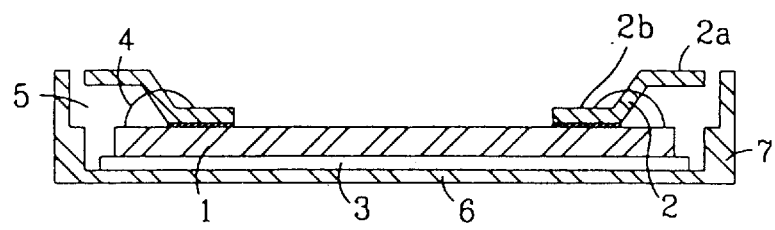
Figure 6F:
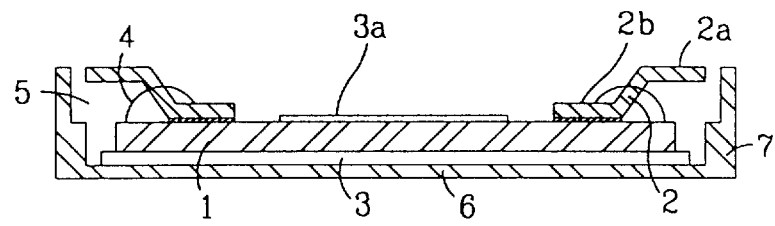

FIG. 6e is a cross-sectional view illustrating a step of connecting the inner leads 2b and the chip pad of the semiconductor chip 1 by using conductive wire 4. The conductive wire 4 is made of a suitable conductive material. FIG. 6F is a cross-sectional view illustrating a step of uniformly coating the second adhesive material 3a on an upper center portion of the semiconductor chip 1. The second adhesive member 3a is made of a material having a good heat transfer ratio.

Figure 6G:
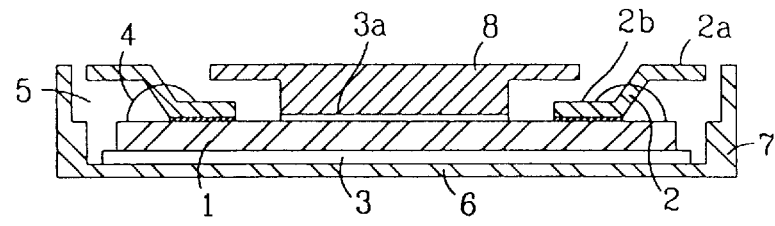
Figure 6H:
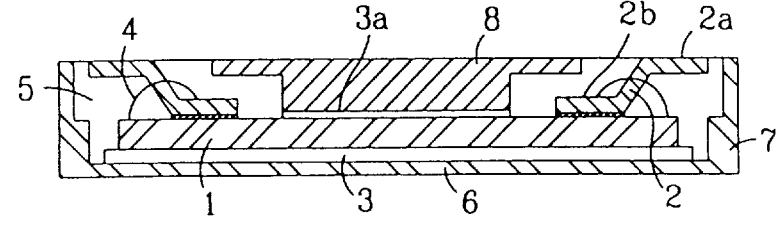

FIG. 6g is a cross-sectional view illustrating a step of fixing the third heat slug 8 on the upper center portion of the semiconductor chip 1 by using the second adhesive material 3a. The third heat slug 8 is made of a metal or ceramic material having a good heat transfer ratio and mechanical strength. FIG. 6h is a cross-sectional view illustrating a step of filling the portion defined by the first through third heat slugs 6, 7, and 8 with a molding resin while exposing the bottom leads 2a outwardly, so that the semiconductor chip 1, the inner leads 2b, the bottom leads 2a, and the conductive wire 4 are sealed, for thus forming the molding portion 5.

As described above, the bottom lead semiconductor package according to the present invention is directed to more effectively radiates the heat generated by the semiconductor chip 1 using the first, second, and third heat slugs 6, 7, and 8 fixed to the upper and lower surfaces and lateral sides of the semiconductor chip 1. Thus, the bottom lead semiconductor package according to the present invention is well suited for a high power chip which requires a high heat transfer efficiency to dissipate high heat generated during operation of the chip. In addition, it is possible to increase the adherence of the molding portion 5 by forming protruding portions 11a from the flange 11 of the third heat slug 8 having a circular shape or a polygonal shape, for example.

It will be apparent to those skilled in the art that various modifications and variations can be made in the semiconductor package and method for fabricating the same of the present invention without departing from the spirit or scope of the invention. Thus, it is intended that the present invention cover the modifications and variations of the invention provided they come within the scope of the appended claims and their equivalents.

What is claimed is:

1. A method for making a semiconductor package, the method comprising the steps of:
    forming a first heat slug;
    forming a second heat slug coupled to the first heat slug;
    mounting a semiconductor chip on the first heat slug;
    forming a third heat slug on the semiconductor chip, wherein the third heat slug includes a flange having a protruding portion with a circular or polygonal shape;
    attaching a plurality of leads to the semiconductor chip;
    connecting the leads to the semiconductor chip using conductive wires; and
    molding the semiconductor chip, the leads, and the conductive wires to form the package.

2. The method according to claim 1, wherein the second heat slug is formed integrally with the first heat slug.

3. The method according to claim 1, wherein a portion of leads are exposed to the outside.

4. A semiconductor package comprising:
    a first heat slug;
    a second heat slug coupled to the first heat slug;
    a semiconductor chip mounted on a surface of the first heat slug;
    a third heat slug attached on the semiconductor chip, wherein the third heat slug includes a flange having a protruding portion with one of a circular and a polygonal shape;

a plurality of leads attached to the semiconductor chip;

conductive wires connecting the plurality of leads to the semiconductor chip; and a mold portion sealing the semiconductor chip, the plurality of leads, and the conductive wires.

5. The semiconductor package according to claim 4, wherein the second heat slug is integral with the first heat slug.

6. The semiconductor package according to claim 4, wherein the first, the second, and the third heat slugs are formed of a material with a high heat transfer ratio.

7. The semiconductor package according to claim 4, wherein a portion of the leads are exposed to the outside.

8. The semiconductor package according to claim 4, wherein the plurality of leads are connected to the semiconductor chip using a bump.

9. The semiconductor package according to claim 4, wherein the first, the second, and the third heat slugs include a metal or ceramic material.

10. The semiconductor package according to claim 4, wherein the third heat slug is attached to a top surface of the semiconductor chip.

11. A semiconductor package comprising:

a first heat slug;

a second heat slug coupled to the first heat slug;

a semiconductor chip mounted on an upper surface of the first heat slug;

a plurality of leads attached to the semiconductor chip;

a plurality of conductive wires connecting the plurality of leads to the semiconductor chip;

a third heat slug attached to the semiconductor chip, wherein the third heat slug includes a flange in at least one side thereof, the flange including a protruding portion with a circular or polygonal shape; and a mold portion sealing the semiconductor chip, the plurality of leads, and the conductive wires.

12. The semiconductot package according to claim 11, wherein the second heat slug is integral with the first heat slug.

13. The semiconductor package according to claim 11, wherein a portion of leads are exposed to the outside.

* * * * *